(12) United States Patent
Hsieh

(10) Patent No.: US 6,815,756 B2
(45) Date of Patent: Nov. 9, 2004

(54) STRUCTURE FOR SPLIT FLASH MEMORY CELLS CONTAINING A PROGRAMMING INJECTOR AND A METHOD FOR FABRICATING THE STRUCTURE

(75) Inventor: Chia-Ta Hsieh, Tainan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/323,983

(22) Filed: Dec. 19, 2002

(65) Prior Publication Data

US 2004/0119106 A1 Jun. 24, 2004

(51) Int. Cl.[7] .............................................. H01L 29/788
(52) U.S. Cl. ...................... 257/315; 257/316; 257/317; 257/318; 438/257; 438/261; 438/265
(58) Field of Search ................................. 257/315–319; 438/257–267

(56) References Cited

U.S. PATENT DOCUMENTS

| | | | |
|---|---|---|---|
| 5,583,811 A | 12/1996 | Van Houdt et al. | ..... 365/185.15 |
| 6,091,634 A | 7/2000 | Wong | ..... 365/185.14 |
| 6,174,772 B1 | 1/2001 | Hsieh et al. | ..... 438/264 |
| 6,228,695 B1 | 5/2001 | Hsieh et al. | ..... 438/201 |
| 6,229,176 B1 | 5/2001 | Hsieh et al. | ..... 257/316 |
| 2003/0218203 A1 * | 11/2003 | Hsieh | ..... 257/315 |

* cited by examiner

Primary Examiner—Hsien Ming Lee
(74) Attorney, Agent, or Firm—Thomas, Kayden, Horstemeyer & Risley

(57) ABSTRACT

A split gate structure is disclosed for improved programming and erasing efficiency. Source/drain regions are equally spaced along the active regions and are electrically connected by source/drain towers that run perpendicular to the active regions. Floating gate towers are situated between each pair of source/drain towers. A floating gate tower has insulating layers separating floating gates, which exist only over active regions crossed by the floating gate tower, from a semiconductor region. An insulating layer separates the floating gates from a top gate and an insulating layer is disposed over the top gate. Insulator spacers are disposed over the sidewalls. Programming injectors, in electrical contact with the semiconductor region, are disposed against the sidewalls of the floating gate towers except where there are source/drain towers and taper to a sharp edge at a height so that they face the floating gates. Selected gates are disposed over the active regions.

32 Claims, 7 Drawing Sheets

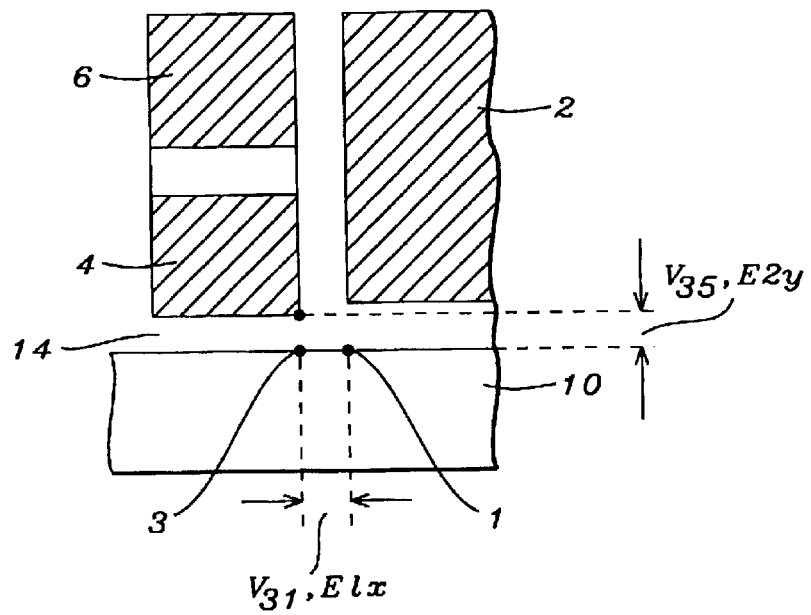
FIG. 1 – Prior Art
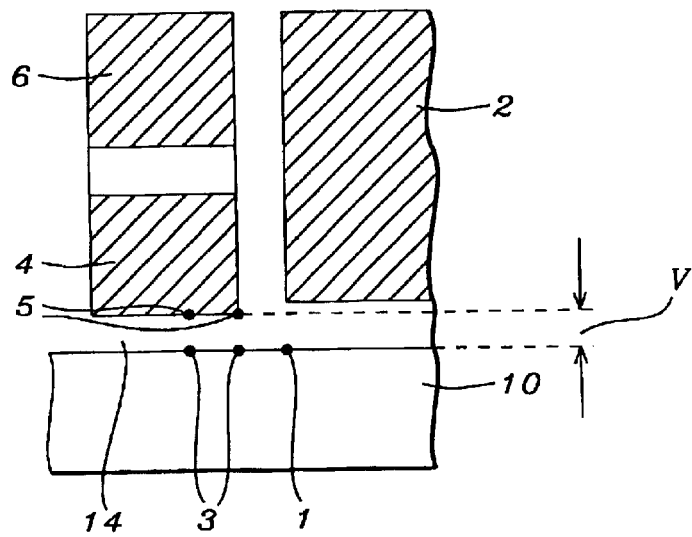
FIG. 2 – Prior Art

STRUCTURE FOR SPLIT FLASH MEMORY CELLS CONTAINING A PROGRAMMING INJECTOR AND A METHOD FOR FABRICATING THE STRUCTURE

BACKGROUND OF THE INVENTION (1) Field of the Invention

The present invention relates generally to semiconductor integrated circuit technology and more particularly to split gate memory cells used in flash EEPROMs (Electrically Erasable Programmable Read Only Memory).

(2) Description of Prior Art

A basic operation in split gate flash EEPROMs is the programming operation. In the programming operation charge is introduced into the floating gate of the crack gate flash memory cell. Traditionally when programming by source side injection, the introduction of charge into the floating gate is accomplished in two steps. In the first step, channel electrons are heated by the electric field parallel to the channel so that when they are opposite the floating gate there is a significant number of electrons with increased energy. Secondly, the electrons must overcome the gate oxide potential barrier to pass into the floating gate. The higher the electron energy and the electric field normal to the channel the easier it is to penetrate the barrier and the more efficient the charging of the floating gate. This two-step process is shown in FIG. 1. Electrons in the channel at point 1, under selected gate 2, are accelerated in passing to point 3, under the floating gate 4, by a field $E1x$, which is determined by the potential difference, $V31$, between points 3 and 1. The voltage of the selected gate, which should be low, determines the potential at point 1. The voltage applied to the top gate, 6, determines the voltage of the floating gate to which it is coupled. The voltage of the floating gate, which should be high, in turn determines the voltage at point 3. The larger is $V31$ the larger is the hot electron generation rate, the rate at which electrons gain energy. To enter the floating gate, such as by going from point 3 to point 5, channel electrons need to traverse the potential barrier posed by the gate oxide, 14. The rate at which electrons traverse the gate oxide barrier depends on the electron energy, the direction of the electron's motion relative to the barrier, and the electric field, $E2y$, across the barrier. The electric field $E2y$ is determined by the voltage of the floating gate, which is determined by the voltage applied to the top gate. Higher electron energy, motion more normal to the barrier and higher fields across the barrier are favorable for barrier penetration. $E1x$, which is perpendicular to $E2y$, determines electron energy and thus these two fields act independently. Furthermore the action of $E1x$ is to accelerate electrons along the direction of the channel, which is in a direction parallel to the barrier or the least efficient direction. Only electrons that scatter and who's scattering angle is near a right angle, so that after scattering they are moving normal to the barrier, will have a reasonable probability of traversing the barrier. To overcome these distractions in the efficiency of charging the floating gate, high voltages need be applied to the top gate. However, high voltages result in decreased reliability. It is a major objective of the invention to provide a split gate flash structure with increased floating gate charging efficiency that requires lower top gate applied voltage and thus possesses increased reliability.

Another basic operation in split gate flash EEPROMs is the erasing operation in which in which the floating gate is discharged. Traditionally the erasing operation is accomplished as shown in FIG. 2. Electrons pass from the floating gate, 4, through the gate oxide, 14, into the semiconductor region 10 under the influence of the potential difference V across the gate oxide. In the traditional structure, with planer geometry for the semiconductor region surface and for the facing floating gate surface, V is required to be large for efficient erasing. As a result high applied voltages are required which leads to decreased reliability. It is therefore a major objective of the invention to provide a split gate flash structure with increased floating gate erasing efficiency that requires lower top gate applied voltage and thus possesses increased reliability.

Hsieh et al., U.S. Pat. No. 6,228,695, shows a split gate flash memory cell having self-aligned source and with floating gate self-aligned to control gate. Hsieh et al. U.S. Pat. No. 6,229,176 shows a split gate flash memory cell with step poly with improved programming speed. U.S. Pat. No. 5,583,811 to Van Houdt et al. shows an EEPROM cell structure with enhanced injection efficiency. U.S. Pat. No. 6,091,639 to Wong shows a split gate nonvolatile memory cell that is highly scalable.

SUMMARY OF THE INVENTION

It is a primary objective of the invention to provide a split gate flash structure with increased programming and erasing speed. It is another primary objective of the invention to provide a split gate flash structure that requires lower top gate applied voltage and thus possesses increased reliability. Yet another primary objective is to provide a split gate flash structure whose cell decrease is not limited by the circuitry required to deliver the high voltage needed for traditional programming and erasing processes. It is yet another primary objective of the invention to provide a method to fabricate a split gate flash structure with increased programming and erasing speed. It is yet another primary objective of the invention to provide a method to fabricate a split gate flash structure that requires lower top gate voltage and thus possesses increased reliability. Yet another primary objective is to provide a method to fabricate a split gate flash structure whose cell decrease is not limited by the circuitry required to deliver the high voltage needed for traditional programming and erasing processes.

These objectives are achieved in the invention by a split gate flash structure in which enhanced programming speed is attained by the use of high efficiency injectors fabricated directly on the semiconductor region. With the injectors being in direct electrical contact with the semiconductor region the planarity of the semiconductor's surface is disturbed and the injectors are so disposed that, as a consequence, erase injectors are formed, thus also enhancing the speed of the erase operation. Therefore, there is an increase in the speed of both the programming and erasing operations. Consequently, the top gate voltage can be reduced with no sacrifice in efficiency, which eliminates the need for special circuitry to achieve high voltage and thus facilitates decreasing the cell size. In addition, lower voltage results in improved reliability.

A split gate structure is disclosed for improved programming and erasing efficiency. A semiconductor region extending to the surface of a substrate has isolation regions surrounding parallel active regions. Source/drain regions in the semiconductor region are equally spaced along the active regions and are electrically connected by source/drain connecting regions, denoted source/drain towers, disposed over said source/drain regions and running perpendicular to the active regions. A multiplicity of structures denoted floating gate towers, parallel to the source/drain towers are situated between each pair of said source/drain towers. A floating gate tower having first insulating layers, disposed over the semiconductor region within the active regions crossed by the floating gate tower, separating floating gates, which exist only over active regions crossed by the floating gate tower, from the semiconductor region. A second insulating layer separates the floating gates from a top gate and a third insulating layer is disposed over the top gate. Insulator spacers are disposed over the sidewalls. The second insulating layer, top gate, third insulating layer and insulator spacers exist over the entire floating gate tower. Programming injectors are disposed against the sidewalls of the floating gate towers except where there are source/drain towers. The programming injectors are in electrical contact with the semiconductor region and taper to a sharp edge against the sidewalls of the floating gate towers at a height so that they face the floating gates. Selected gates, parallel and disposed over the active regions, are separated from the semiconductor region, the programming injectors and the source/drain towers by a fourth insulating layer.

BRIEF DESCRIPTION OF THE DRAWINGS

In the accompanying drawing forming a material part of this description, there is shown:

FIG. 1 shows a traditional programming operation by source side injection.

FIG. 2 shows a traditional erasing operation.

DESCRIPTION OF THE PREFERRED EMBODIMENTS

Figure 3A:
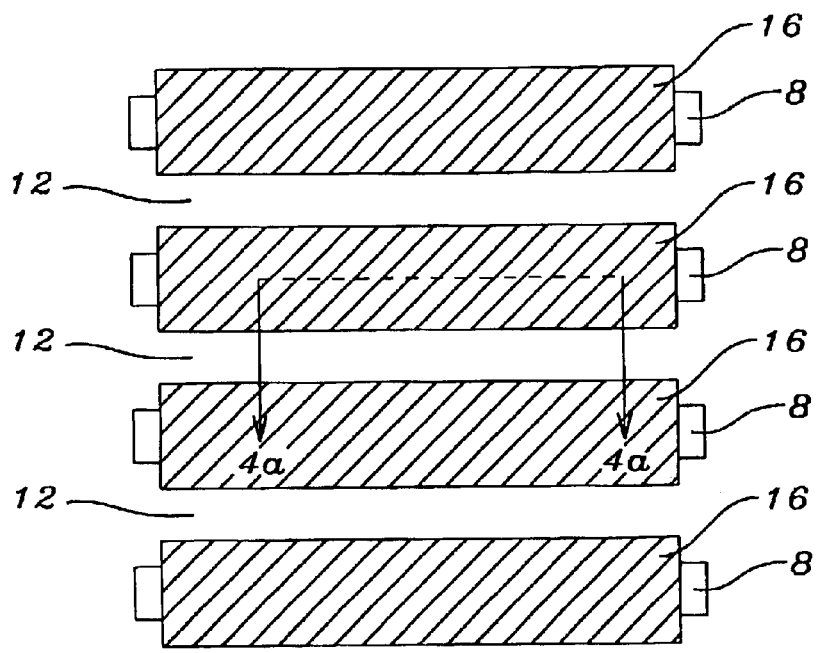
FIGS. 3a–3e show top views depicting a method of forming split gate flash memory cells according to the invention.
Figure 3B:
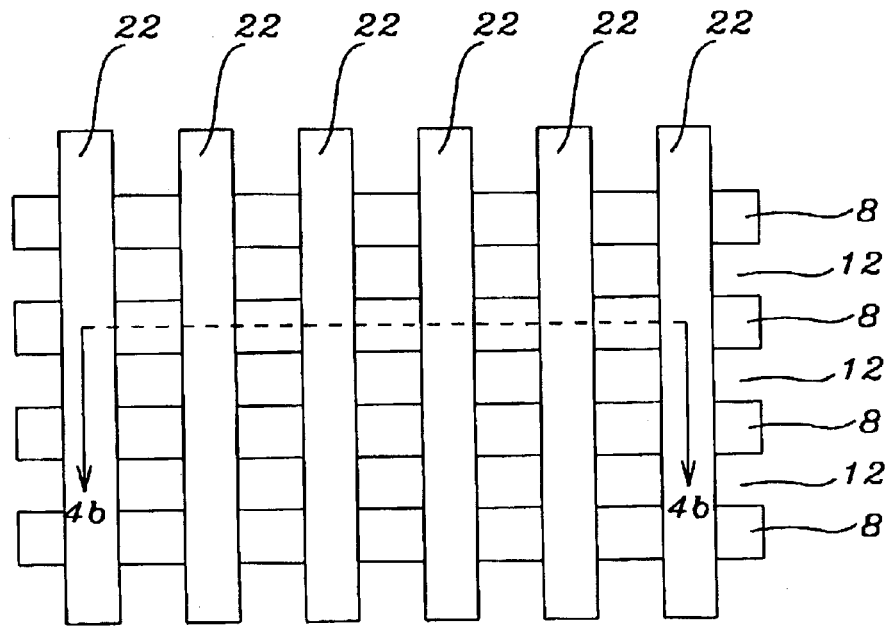
Figure 3C:
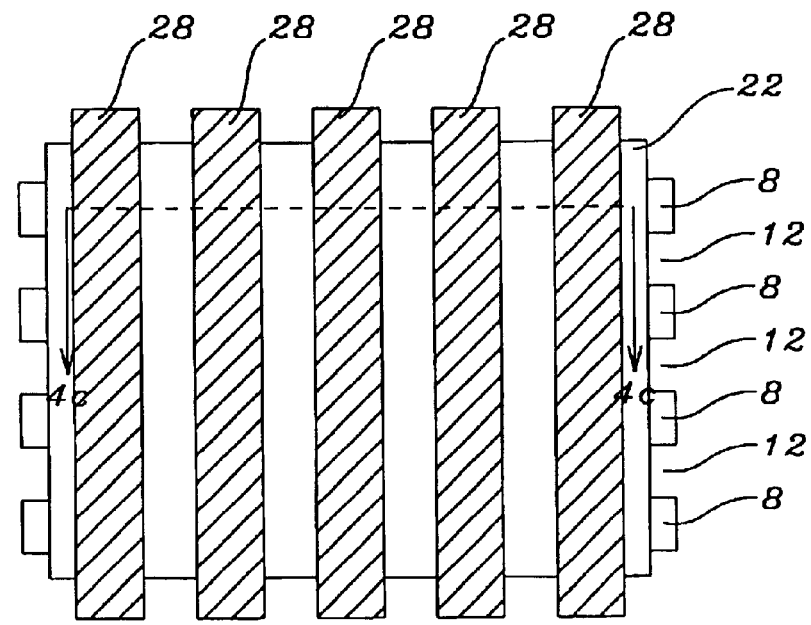
Figure 3D:
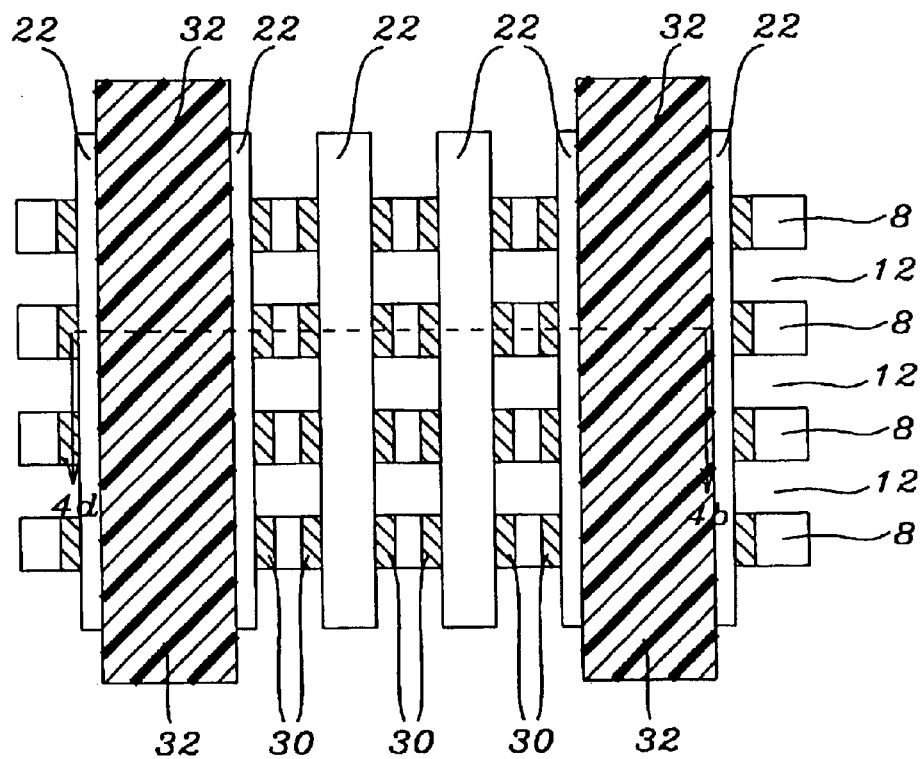
Figure 3E:
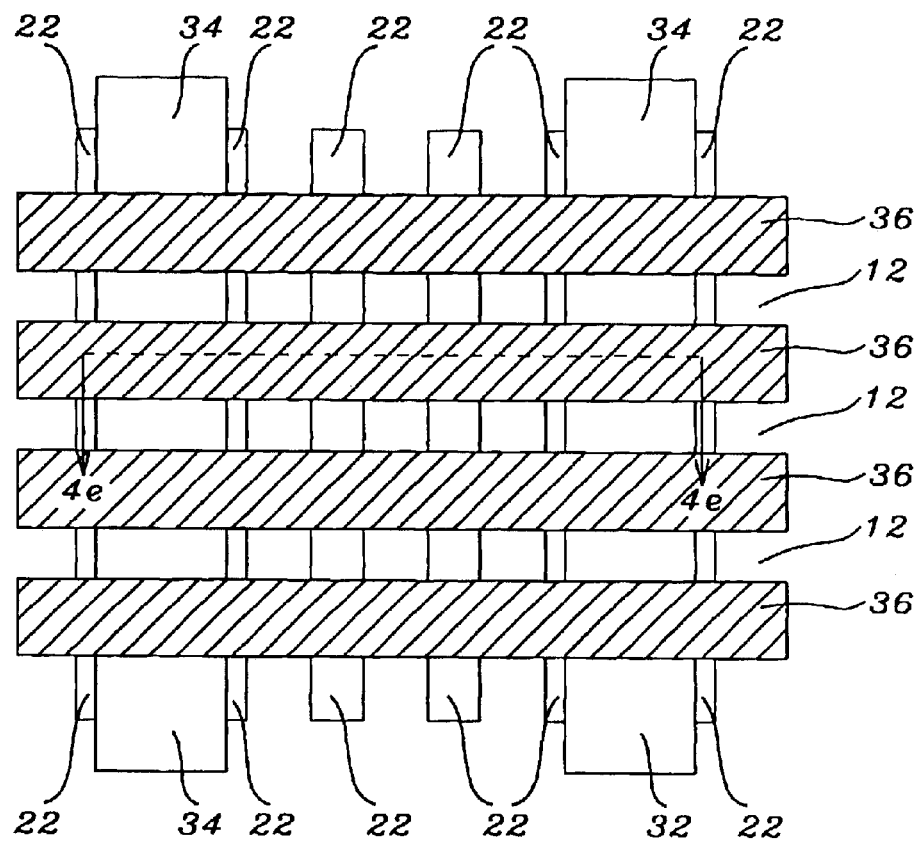
Figure 4A:
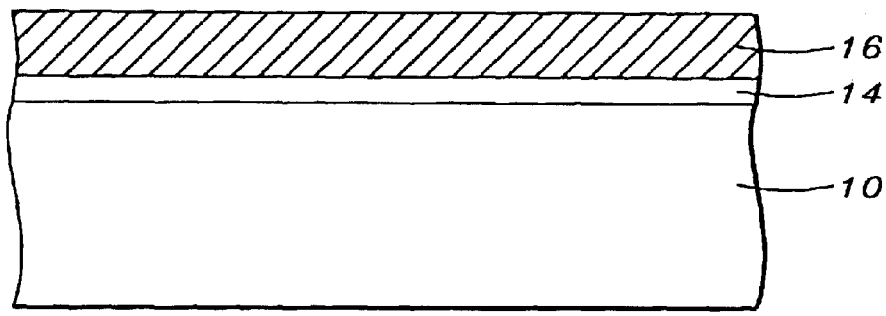
FIGS. 4a–4e show cross-sectional views depicting a method of forming split gate memory cells according to the invention.
Figure 4B:
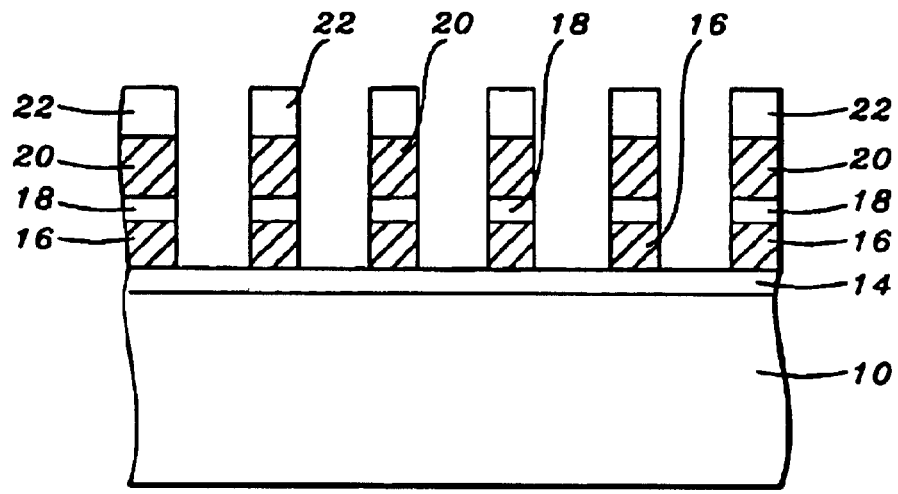

Preferred embodiments of the invention are well described with the aid of FIGS. 3a–3e and 4a–4e. A method of fabricating a novel split gate flash memory cell with high speed programming and erasing is presented in FIGS. 3a–3e, where top views of the cell are presented at successive stages of the process and in FIGS. 4a–4e, which show the corresponding cross-sectional views. Active regions, 8, are defined on a p-type semiconductor region, 10, which preferably is a silicon substrate, using isolation regions, such as shallow trench isolation, STI, regions, 12. An implant is performed to adjust the cell threshold voltage, which may be a boron implant at about 20 keV to a dose of about 5E11 per sq. cm. A floating gate oxide 1, 14, is then formed to a thickness of about 150 Angstroms, followed by deposition of a conductive layer, which preferably is a poly 1 layer, 16, to a depth of about 800 Angsuoms. A photoresist layer is formed aid patterned to partially define the poly I floating gates. Adler a poly I etch, to achieve the shape of region 16 as shown in FIG. 2a, and removal of the photoresist, the structure is as depicted in FIGS. 3a and 4a.

Figure 4C:
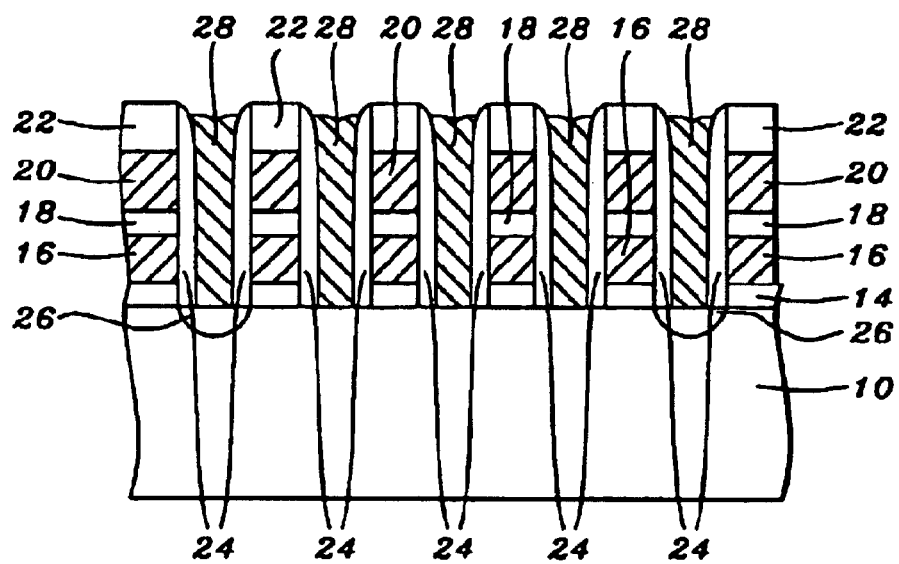

The method of the invention continues with formation of a dielectric separator layer, 18, between the poly I floating gates and poly 2 control gates, also called top gates, which are disposed over the dielectric separator. This dielectric separator layer often consists of composite oxide/nitride/oxide (ONO) layers, with the layer thickness being about 75,150,30 Angstroms, respectively. There follows a deposition of a conductive layer, 20, which preferably is about 1000 Angstroms of poly 2 and then a deposition of about 1500 Angstroms of nitride I, 22, which is preferably a silicon nitride layer. Patterning these layers is the next step, which is preferably accomplished using techniques that utilize photoresist. A photoresist layer is formed and patterned to define the control gates. Successively etching the nitride layer, the poly 2 layer, the ONO layer and the poly I layer and then removing the photoresist results in the structure depicted in FIGS. 3b and 4b. The ONO layer, 18, provides dielectric separation between the poly 2 layer, 20, which acts as a top gate, and the poly I floating gate, 16. The nitride 1 layer, 22, is required for dielectric separation between poly 2 and subsequent poly layers. The ONO layer, 18, the poly 2 layer, 20, and the nitride layer, 22, are each in the form of parallel stripes perpendicular to the active regions 8. Next, a second oxide layer is deposited, which preferably is about 300 Angstroms of high temperature oxide (HTO). This second oxide layer is then etched to form sidewall spacers 24, as seen in FIG. 4c. During this etching step exposed floating gate oxide regions are also removed so that the semiconductor surface is completely bare in these regions. The structures built up over the semiconductor region to this point, containing the floating gate oxide, 14, floating gate, 16, the ONO layer, 18, the top gate, 20, the nitride layer, 22, and the sidewall spacer, 24, are designated floating gate towers.

The next step is to form source/drain regions, 26. These are formed by ion implantation into the semiconductor region through the spaces between some of the floating gate towers, while shielding the semiconductor region between the other floating gate towers. This can be accomplished by forming a photoresist layer, patterning the photoresist layer so that the spaces between floating gate towers are filled with photoresist except where source/drain regions will be formed, performing the ion implantation and then removing the photoresist layer. Preferably, Arsenic ions are implanted at energy of about 50 keV and to a dose of about 3E15 per sq. cm. As shown in FIG. 4c there are four floating gate towers between consecutive source/drain regions, however that is for purpose of illustration. The number of floating gate towers between consecutive source/drain regions can actually vary between two and about 1024. A third conductive layer is now deposited, which preferably is a plug poly 3 layer deposited to a thickness of about 3000 Angstroms. This plug poly 3 layer is then etched back to a level just below the top of nitride layer 22, attaining the shape region 28. The poly 3 layers that over source/drain regions, and which are perpendicular to the active regions 8, are to be used as conductive lines contacting the source drain regions. These are to be denoted source/drain towers. The structure at this stage of the process is as shown in FIGS. 3c and 4c.

Figure 4D:
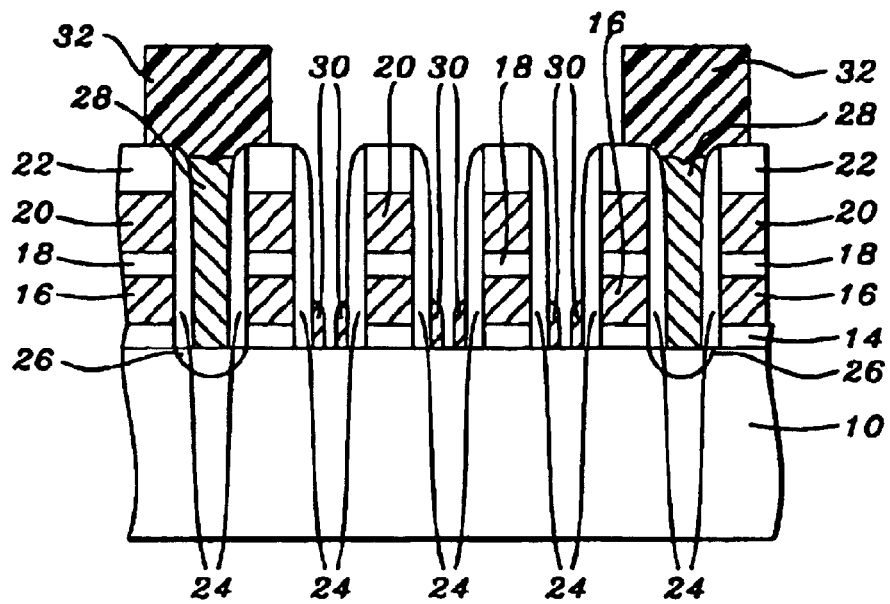
Figure 4E:
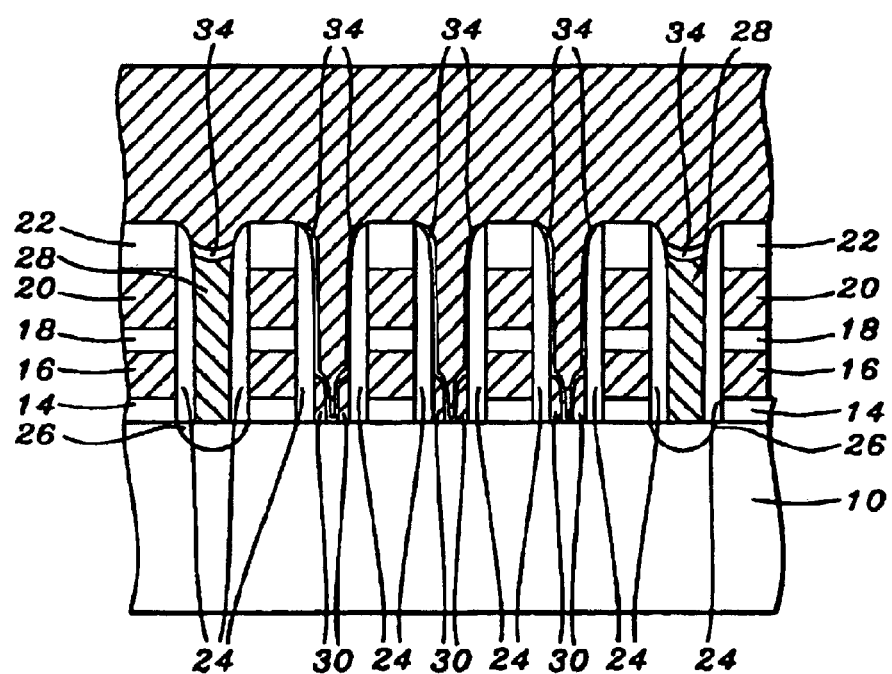

The next processing steps, in which programming injectors are fabricated, are crucial to the invention. Masking the source/drain towers, a poly 3 spacer etch back is performed. This can be accomplished by forming a photoresist layer, patterning the photoresist layer so that only the source/drain towers are masked by the photoresist, 32, as indicated in FIGS. 3d and 4d, performing the plug poly 3 spacer etch back and then removing the photoresist layer. As shown in FIGS. 4c and 4d plug poly 3 is removed from regions not masked except for poly tip regions, 30, disposed directly over the semiconductor surface along the sidewalls of the floating gate towers. A third oxide layer, 34, is deposited, which preferably is about 200 Angstroms of gate quality oxide. As is apparent from FIG. 4e, the oxide layer 34 is the gate oxide for the selected gates 36 that are to be formed next. It also insulates the selected gates from the source/drain towers, 28, and from the poly tip programming injectors, 30. A fourth poly layer is then deposited to a thickness of about 3000 Angstroms. Patterning of the fourth poly layer is preferably accomplished by forming a photoresist layer, patterning the photoresist layer and etching the poly 4 layer to achieve the form, 36, shown in FIGS. 3e and 4e. Finally, the photoresist layer is removed, which completes the process.

Figure 5:
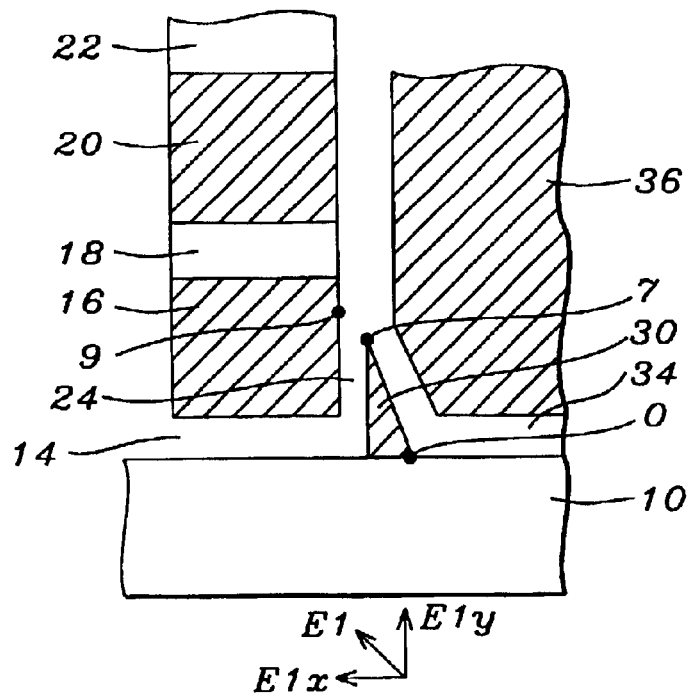
FIG. 5 shows programming according to the invention.

Mechanisms involved in the programming operation of the novel split gate flash memory cell according to the invention are well described with the aid of FIG. 5, which includes the relevant components of the cell. In the programming operation charge is introduced into the floating gate of the split gate flash memory cell. As in traditionally programming by source side injection, the introduction of charge into the floating gate can be considered to be accomplished in two steps. In the first step, channel electrons are heated by the electric field, so that when they reach the floating gate oxide barrier there are a significant number of electrons with increased energy. Secondly, the electrons must overcome the oxide potential barrier to pass into the floating gate. The higher the electron energy and the electric field normal to the channel the easier it is to penetrate the barrier and the more efficient the charging of the floating gate. This two-step process for structures according to the invention is shown in FIG. 5. Electrons in the programming injector, 30, at point 0, under selected gate 36, are accelerated by a field E1 in passing to point 7, at the edge of the oxide spacer, 24, separating the programming injector, 30, and the floating gate, 16. The field E1 is determined by the potential difference, V70, between points 7 and 0. The voltage of the selected gate, which should be low, determines the potential at point 0. The voltage applied to the top gate, 20, determines the voltage of the floating gate to which it is coupled. The voltage of the floating gate, which should be high, in turn determines the voltage at point 7. The larger is V70 the larger is the hot electron generation rate, the rate at which electrons gain energy. To enter the floating gate, such as by going from point 7 to point 9, channel electrons need to traverse the potential barrier posed by the oxide, 24. The rate at which electrons traverse the oxide barrier depends on the electron energy, the direction of the electron's motion relative to the barrier, and the electric field, E2x, at the emitting surface. The electric field E2x is determined by the voltage of the floating gate, which is determined by the voltage applied to the top gate, the thickness of oxide 24 and the shape of the emitting surface. Sharp tips such as at point 7 are favorable because of the higher fields at sharp tips. Higher electron energy, motion more normal to the barrier and higher fields at the emitting surface are favorable for barrier penetration. The component, E1x, of E1 normal to the barrier, is in the same direction as E2x. Thus these two fields act in unison. Furthermore, the action of E1x is to accelerate electrons in a direction normal to the oxide 24, which is the most efficient direction for barrier penetration. Having a significant component, E1x, of the heating field, E1, in the same direction as E2x provides for increased efficiency of programming for source side injection. As a result of the increased efficiency in charging the floating gate for structures of the invention, lower voltages can be applied to the top gate than for traditional split gate flash cells. Lower voltages result in increased reliability, an important advantage of the split gate flash cell according to the invention.

Figure 6:
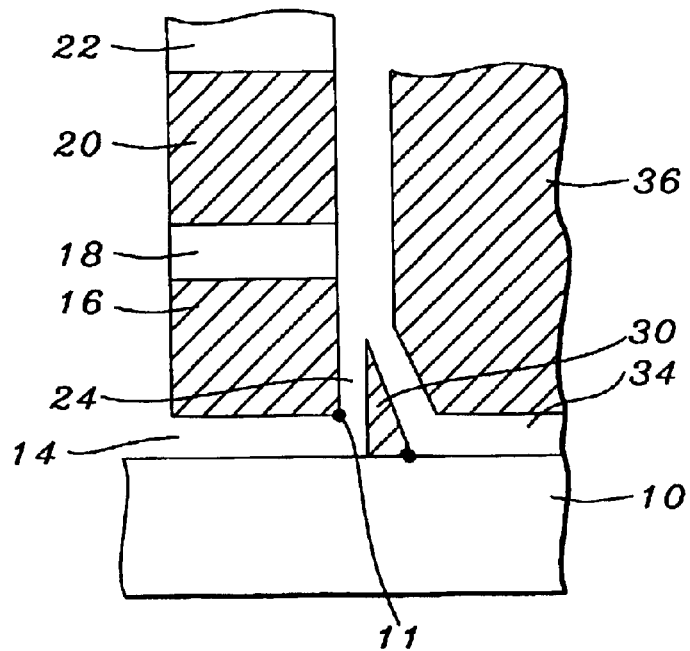
FIG. 6 shows erasing according to the invention.

Increased efficiency in the erase operation, the operation in which in which the floating gate is discharged, over that of conventional split gate flash EEPROMs is also an advantage of the structures of the invention. The source of this advantage is shown in FIG. 6. Because the programming injector rises above the semiconductor region surface and is in intimate electrical contact with that surface, the corner of the floating gate, such as the point 11 in FIG. 6, forms an efficient injector of charge by Fowler-Nordheim tunneling from the floating gate into the semiconductor region or the programming injector. This is due to the increased field at the corner and the resulting increased tunneling rate. Lower voltages are thus possible to achieve a desired erasing efficiency than for traditional structures. In traditional structures, with planer geometry for the semiconductor region surface, the voltage is required to be large for efficient erasing. As a result high applied voltages are required Which leads to decreased reliability. It is therefore a major objective of the invention to provide a split gate flash structure with increased floating gate erasing efficiency that requires lower top gate applied voltage and thus possesses increased reliability.

While the invention has been particularly shown and described with reference to the preferred embodiments thereof, it will be understood by those skilled in the art that various changes in form and detail may be made without departing from the spirit and scope of the invention.

What is claimed is:

1. A split gate structure for improved programming and erasing efficiency comprising:

a semiconductor region extending to the surface of a substrate, having isolation regions surrounding parallel active regions and having source/drain regions in said semiconductor region equally spaced along said active regions and are electrically connected by source/drain connecting regions, denoted source/drain towers, that are disposed over said source/drain regions and run perpendicular to said active regions;

a multiplicity of floating gate towers, parallel to said source/drain towers, bounding and situated between each pair of said source/drain towers, said floating gate towers having first insulating layers, disposed over the semiconductor region within said active regions crossed by said floating gate tower, said first insulating layers separating floating gates from said semiconductor region, said floating gates existing only over active region areas crossed by the floating gate tower, a second insulating layer separates said floating gates from a top gate, a third insulating layer disposes over the top gate and insulator spacers being disposed over sidewalls of said floating gate towers, wherein said second insulating layer, said top gate, said third insulating layer and said insulator spacers exist over said floating gate tower;

programming injectors disposed against the sidewalls of said floating gate towers except where there are source/drain towers, said programming injectors being in electrical contact with said semiconductor region and tapering to a sharp edge against the sidewalls of said floating gate towers at a height so that they face said floating gates;

selected gates parallel and disposed over said active regions that are separated from said semiconductor region, said programming injectors and said source/drain towers by a fourth insulating layer.

2. The structure of claim 1 wherein said semiconductor region is a silicon p-well or a part of a p-type silicon substrate.

3. The structure of claim 1 wherein said isolation regions are shallow trench isolation regions.

4. The structure of claim 1 wherein said source/drain regions are n-type.

5. The structure of claim 1 wherein said source/drain electrical connecting regions are polysilicon regions.

6. The structure of claim 1 wherein said multiplicity of structures is a number between 2 and 1024.

7. The structure of claim 1 wherein said first insulating layer is a gate oxide layer.

8. The structure of claim 1 wherein a thickness of said first insulating layer is about 150 Angstroms.

9. The structure of claim 1 wherein said floating gate is composed of polysilicon.

10. The structure of claim 1 wherein said top gate is composed of polysilicon.

11. The structure of claim 1 wherein said second insulating layer is an ONO layer in which a bottom oxide thickness is about 75 Angstroms, a nitride thickness is about 150 Angstroms and a top oxide thickness is about 30 Angstroms.

12. The structure of claim 1 wherein said third insulating layer is a nitride layer of thickness about 1500 Angstroms.

13. The structure of claim 1 wherein said insulator spacers are formed by depositing about 400 Angstroms of HTO oxide and performing a spacer etch.

14. The structure of claim 1 wherein said programming injector is composed of polysilicon.

15. The structure of claim 1 wherein said selected gates are composed of polysilicon deposited to a thickness of about 1500 Angstroms.

16. The structure of claim 1 wherein said fourth insulating layer is an oxide layer formed to a thickness of about 200 Angstroms.

17. A method to fabricate a new split gate memory cell structure for improved programming and erasing efficiency comprising:

providing a semiconductor region extending to the surface of a substrate;

defining parallel active regions on said semiconductor region by forming isolation regions that surround said active regions;

forming a first insulator layer over said active regions;

forming a first conductor layer over said first insulator layer and patterning said first conductor layer to achieve parallel strips that are parallel to and disposed over said active regions;

successively forming three blanket layers, including a second insulating layer, a second conductive layer and a third insulator layer; patterning said three blanket layers to form equally spaced three-layer deep parallel strips perpendicular to the active regions; removing any of said first conductor layer that is not under said three layer deep strips; depositing a sidewall insulator layer and etching said sidewall insulator layer to form insulator spacers, whereby forming equally spaced floating gate towers, which are enclosed by said insulator spacers, said first insulator layer and said third insulator layer;

forming source/drain regions in the vicinity of the exposed surface of said semiconductor region in a number of the spaces between adjacent said floating gate towers so that there is a multiplicity of said floating gate towers between successive source/drain regions;

forming source/drain connection regions by filling spaces between floating gate towers that contain said source/drain regions with a third conductive layer almost to the top of said floating gate towers;

forming programming injectors in spaces between said floating gate towers not containing source/drain regions by filling said spaces with an injector conductive layer almost to the top of said floating gate towers and performing a spacer etch thereby forming said programming injectors that taper to a sharp edge against sidewalls of said floating gate towers where the height of said programming injectors are such that they face said floating gates and exposing the semiconductor region surface of those spaces except near the sidewalls of said floating gate towers where said programming injectors are situated;

forming a fourth insulator layer to act as a selected gate insulator and to insulate said programming injectors and said source/drain connecting regions from selected gates;

forming strips of selected gates by disposing a fourth conducting layer over and parallel to the active regions.

18. The method of claim 17 wherein said semiconductor region is a p-well or a part of a p-type substrate.

19. The method of claim 17 wherein said isolation regions are shallow trench isolation regions.

20. The method of claim 17 wherein said first insulating layer is a gate oxide layer of thickness about 150 Angstroms.

21. The method of claim 17 wherein said first conductor layer is a polysilicon layer having a thickness of about 800 Angstroms.

22. The method of claim 17 wherein said second insulating layer is an ONO layer, with the thickness of the bottom oxide, nitride and top oxide layers being about 75, about 150 and about 30 Angstroms, respectively.

23. The method of claim 17 wherein said second conductor layer is a polysilicon layer having a thickness of about 1000 Angstroms.

24. The method of claim 17 wherein said third insulator layer is a nitride layer having a thickness of about 1500 Angstroms.

25. The method of claim 17 wherein said insulator spacers are formed by depositing about 400 Angstroms of HTO oxide and performing a spacer etch.

26. The method of claim 17 wherein said fourth insulator layer is an oxide layer having thickness of about 200 Angstroms.

27. The method of claim 17 wherein said source/drain regions are formed by implantation of As ions at energy of about 50 keV to a dose of about 3E15 per cm2.

28. The method of claim 17 wherein said third conductor layer is a polysilicon layer having a thickness of about 3000 Angstroms.

29. The method of claim 17 wherein said injector conductive layer is a polysilicon layer having a thickness of about 3000 Angstroms.

30. The method of claim 17 wherein said fourth conductor layer is a polysilicon layer having a thickness of about 1500 Angstroms.

31. The method of claim 17 wherein said programming injectors are composed of polysilicon.

32. The method of claim 17 wherein said wherein said multiplicity of floating gate towers is a number between 2 and 1024.

* * * * *